United States Patent [19]

Kumano et al.

[11] Patent Number: 4,943,839
[45] Date of Patent: Jul. 24, 1990

[54] CONTACT TYPE IMAGE SENSOR
[75] Inventors: Masafumi Kumano, Sendai; Kenji Yamamoto, Miyagi, both of Japan
[73] Assignees: Ricoh Company, Ltd., Tokyo; Ricoh Research Institute of General Electronics, Natori, both of Japan
[21] Appl. No.: 233,364
[22] Filed: Aug. 18, 1988
[30] Foreign Application Priority Data
Aug. 19, 1987 [JP] Japan .................. 62-205979
[51] Int. Cl.⁵ .................. H01L 27/14; H01L 31/00
[52] U.S. Cl. .................. 357/30; 357/4; 357/51; 250/578.1
[58] Field of Search .......... 357/30, 4, 51; 250/578
[56] References Cited
U.S. PATENT DOCUMENTS

| 4,091,406 | 5/1978 | Lewis | 357/54 |
| 4,679,088 | 7/1987 | Chiyoma | 357/30 |
| 4,703,169 | 10/1987 | Arita | 250/578 |
| 4,727,407 | 2/1988 | Nobue | 357/30 |
| 4,759,610 | 7/1988 | Yamagisawa | 357/30 |

FOREIGN PATENT DOCUMENTS

| 59-122274 | 7/1984 | Japan | 357/30 |
| 61-251169 | 11/1986 | Japan | 357/30 |
| 61-263157 | 11/1986 | Japan | 357/30 |

Primary Examiner—Jerome Jackson, Jr.
Attorney, Agent, or Firm—Oblon, Spivak, McClelland, Maier & Neustadt

[57] ABSTRACT

A contact type image sensor has a transparent dielectric substrate, an upper transparent electrode, a lower electrode provided on the transparent dielectric substrate, a semiconductor thin film sandwiched between the upper transparent electrode and the lower electrode and constituting a photoelectric conversion part, a transparent dielectric layer formed on a plane of the lower electrode, and an upper electrode formed on the transparent dielectric layer and connected to the upper transparent electrode. The transparent dielectric layer constitutes a capacitance of the image sensor between the upper and lower electrodes.

16 Claims, 5 Drawing Sheets

CONTACT TYPE IMAGE SENSOR

BACKGROUND OF THE INVENTION

The present invention generally relates to image sensors, and more particularly to a contact type image sensor for optically reading a document image in a facsimile machine, for example.

Conventionally, an image sensor constituted by a one-dimensional charge coupled device (CCD) is used to read a document image in an optical apparatus such as a facsimile machine. However, the length of a photoelectric conversion part of the CCD is only in the order of 25 mm, for example, and a reduction system is inevitably required to optically read the document image. As a result, it is difficult to downsize the optical apparatus using such an image sensor because of the need to provide the reduction system.

In order to downsize the optical apparatus, it is necessary to use an image sensor which does not require the reduction system. Such an image sensor should at least have a length identical to the length of one side of the document which is to be read. When reading a document having A4 size, for example, the image sensor must have at least a length of 216 mm. An image sensor having the length of 216 mm cannot be produced by use of crystaline silicon, but it is possible to produce such an image sensor by use of a thin film made of an amorphous (non-crystaline) semiconductor such as amorphous silicon.

It is easy to produce an image sensor which can read a large document by using a semiconductor thin film as a photoelectric conversion layer because the length of the image sensor can easily be made identical to the length of one side of the document. For this reason, various kinds of contact type image sensors using the semiconductor thin film have been proposed. The contact type image sensor reads the document image by making direct contact with the document, and the optical apparatus using the contact type image sensor can be downsized since it is unnecessary to provide the reduction system.

The contact type image sensor generally has a sandwich structure or coplanar structure. The contact type image sensor having the sandwich structure has the semiconductor thin film sandwiched between an upper electrode and a lower electrode. On the other hand, the contact type image sensor having the coplanar structure has the electrodes extending from the sides of the semiconductor thin film on the same plane as the semiconductor thin film. The optical response characteristic of the contact type image sensor having the sandwich structure is better than that of the contact type image sensor having the coplanar structure because the film thickness of the semiconductor thin film can be made smaller in the sandwich structure.

FIG. 1 is a cross sectional view of the conventional contact type image sensor having the sandwich structure. In FIG. 1, the image sensor has a transparent dielectric substrate 1 made of glass, ceramics or the like, a lower metal electrode 2, a semiconductor layer 3 constituting a photoelectric conversion part, and an upper transparent electrode 4. A light receiving region is formed between the electrodes 2 and 4. However, a photocurrent is detected even when an incident light enters a region outside the light receiving region between the electrodes 2 and 4. As a result, there is a problem in that the actual light receiving region spreads, thereby deteriorating the resolution of the image sensor.

In addition, since a capacitance of the contact type image sensor having the charge storage mode is formed in the region between the confronting electrodes 2 and 4, the area of the capacitance formed by the region between the confronting electrodes 2 and 4 is small and the capacitance is limited when the image sensor is divided into bits. Therefore, there is a problem in that the image sensor is easily affected by the stray capacitance of interconnections connecting the image sensor to a driving circuit which is used for reading the document image.

In order to reduce the problems of the conventional image sensor, an image sensor having a structure shown in FIG. 2 has been proposed in a Japanese Laid-Open Patent Application No. 61-82570, for example. In FIG. 2, those parts which are essentially the same as those corresponding parts in FIG. 1 are designated by the same reference numerals, and a description thereof will be omitted. The proposed image sensor has a large region between the confronting electrodes 2 and 4, and a shield layer 5 is formed on the electrode 4. In this case, because the region forming the capacitance of the image sensor has the same layer structure as the photoelectric conversion part, a dark current increases by an amount corresponding to an increase in the area of the sensor part while the photocurrent does not change due to the shield layer 5 which is provided for the purpose of ensuring a certain resolution. As a result, there is a problem in that the performance of the image sensor described by a ratio (photocurrent)/(dark current) becomes deteriorated.

In addition, the part forming the capacitance uses the semiconductor constituting the photoelectric conversion part, but the voltage across the capacitance changes with time because a charge is once stored in the capacitance and discharged by the photocurrent generated responsive to the incident light when reading the document image in the charge storage mode of the image sensor. Accordingly, there is a problem in that the capacitance formed in the semiconductor changes when the voltage changes. Furthermore, because the capacitance is formed by the semiconductor, there is also a problem in that the capacitance also changes due to electrons/holes generated within the semiconductor due to the stray light.

SUMMARY OF THE INVENTION

Accordingly, it is a general object of the present invention to provide a novel and useful contact type image sensor in which the problems described heretofore are eliminated.

Another and more specific object of the present invention is to provide a contact type image sensor comprising a transparent dielectric substrate, an upper transparent electrode, a lower electrode provided on the transparent dielectric substrate, a semiconductor thin film sandwiched between the upper transparent electrode and the lower electrode and constituting a photoelectric conversion part, a transparent dielectric layer formed on a plane of the lower electrode, and an upper electrode formed on the transparent dielectric layer and connected to the upper transparent electrode, where the transparent dielectric layer constitutes a capacitance of the image sensor between the upper and lower electrodes. According to the image sensor of the present invention, it is possible to arbitrarily set the capacitance constituted by the transparent dielectric layer and minimize the undesirable effects of line capacitance. Further, it is possible to read the document image with a high resolution and accuracy.

Still another object of the present invention is to provide a contact type image sensor comprising a transparent dielectric substrate, a lower electrode formed on the transparent dielectric substrate, a transparent dielectric layer formed on a plane of the lower electrode, where the transparent dielectric layer has a window, a semiconductor thin film formed on the lower electrode at the window and constituting a photoelectric conversion part, an upper transparent electrode formed on the semiconductor thin film, and an upper electrode formed on the transparent dielectric layer and connected to the upper transparent electrode, where the transparent dielectric layer constitutes a capacitance of the image sensor between the upper and lower electrodes.

A further object of the present invention is to provide a contact type image sensor comprising a transparent dielectric substrate, a shield layer formed on the transparent dielectric substrate, where the shield layer has a first window, a dielectric layer formed on the shield layer, a lower electrode formed on the transparent dielectric substrate, where the lower electrode has a second window at a position corresponding to the first window, a transparent dielectric layer formed on a plane of the lower electrode, where the transparent dielectric layer has a third window, a semiconductor thin film formed on the lower electrode at the third window and constituting a photoelectric conversion part, an upper transparent electrode formed on the semiconductor thin film, and an upper electrode formed on the transparent dielectric layer and connected to the upper transparent electrode, where the transparent dielectric layer constitutes a capacitance of the image sensor between the upper and lower electrodes.

Other objects and further features of the present invention will be apparent from the following detailed description when read in conjunction with the accompanying drawings.

DETAILED DESCRIPTION

Figure 1:
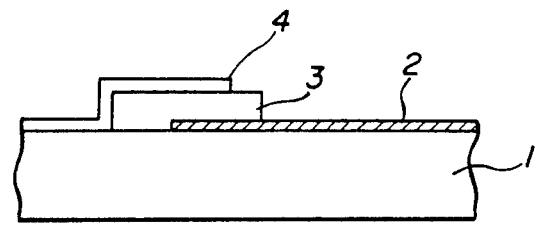
FIG. 1 is a cross sectional view showing the conventional contact type image sensor.
Figure 2:
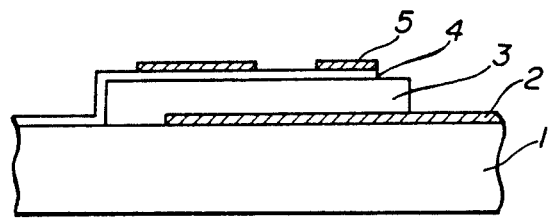
FIG. 2 is a cross sectional view showing the proposed contact type image sensor.
Figure 3:
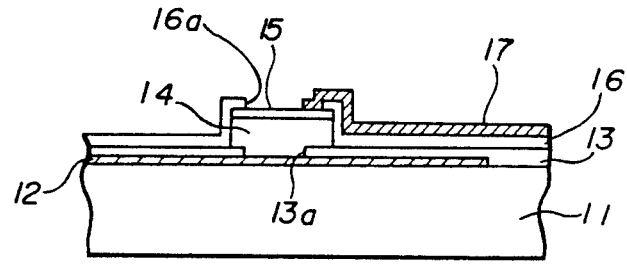
FIG. 3 is a cross sectional view showing a first embodiment of the contact type image sensor according to the present invention.

FIG. 3 shows a first embodiment of the contact type image sensor according to the present invention. In FIG. 3, the image sensor has a transparent dielectric substrate 11, a lower electrode 12, a transparent dielectric layer 13, a semiconductor layer (semiconductor thin film) 14 constituting photoelectric conversion part, an upper transparent electrode 15, a transparent dielectric layer 16, and an upper electrode 17.

The lower electrode 12 is divided into bits and extends in a sub scanning direction on the substrate 11. The transparent dielectric layer 13 is formed on the lower electrode 12, and a window 13a is provided in the transparent dielectric layer 13 at a position where the sensor part is formed. The semiconductor layer 14 covers the window 13a, and the upper transparent electrode 15 is formed on the semiconductor layer 14. The entire exposed surface of the semiconductor layer 14 is covered by the transparent dielectric layer 16 and a window 16a exposes the top of the upper transparent electrode 15. The upper electrode 17 is formed on the transparent dielectric layer 16 and connects to the upper transparent electrode 15.

According to the this embodiment, the transparent dielectric layers 13 and 16 are formed on a plane of the lower electrode 12, that is, on the plane on which the lower electrode 12 is provided. In addition, the upper electrode 17 is formed on the transparent dielectric layer 16.

Next, a description will be given of the processes of producing the first embodiment. For example, quartz or Pyrex (registered trademark) is used for the transparent dielectric substrate 11. Chromium (Cr) is used for the lower electrode 12. Cr is formed on the transparent dielectric substrate 11 by a vapor deposition to a film thickness of approximately 1500 Å, and the lower electrode 12 is formed by a photolithography process carried out with respect to the deposited Cr film. Then, the transparent dielectric layer 13 is formed on the lower electrode 12 to a film thickness of approximately 5000 Å by a plasma chemical vapor deposition (hereinafter simply referred to as a PCVD) using $SiO_2$ or $SiO_xN_y$, and the window 13a is formed by a photolithography process. Thereafter, an amorphous silicon hydride layer is formed by a PCVD using $SiH_4$ gas or the like to a film thickness of 0.5 micron to 2.0 microns, and a transparent conductive layer of indium tin oxide (ITO) or the like by a sputtering, a vapor deposition or the like to a film thickness of approximately 750 Å. The amorphous silicon hydride layer and the transparent conductive layer are patterned by a photolithography process, thereby forming the upper transparent electrode 15 and the semiconductor layer 14, respectively. The transparent dielectric layer 16 is formed by a PCVD using $SiO_2$ or $SiO_xN_y$ to a film thickness of approximately 3000 Å, and the window 16a is formed above the upper transparent electrode 15 by a photolithography process. Finally, Cr, Al/Cr or the like is formed to a film thickness of 0.15 micron to 0.5 micron by a vapor deposition and a photolithography process so as to form and connect the upper electrode 17 to the upper transparent electrode 15.

According to this embodiment, the performance of the image sensor, that is, the ratio (photocurrent)/(dark current) will not be deteriorated and a high value is obtainable for the ratio (photocurrent)/(dark current). In addition, since the transparent dielectric layers 13 and 16 are sandwiched between the upper and lower electrodes 17 and 12, it is possible to obtain an extremely stable capacitance which is unaffected by the incident light and temperature. Furthermore, the capacitance can be changed arbitrarily by varying the thickness of at least one of the transparent dielectric layers 13 and 16 without the need to modify the photolithography pattern, thereby making it possible to easily obtain an optimum capacitance. By forming an appropriate capacitance in the image sensor, the undesirable effects of the stray capacitance of the interconnections and the like can be suppressed and it becomes possible to obtain a large and stable output from the image sensor as confirmed by the experimental results described hereunder.

Figures 4A, 4B:
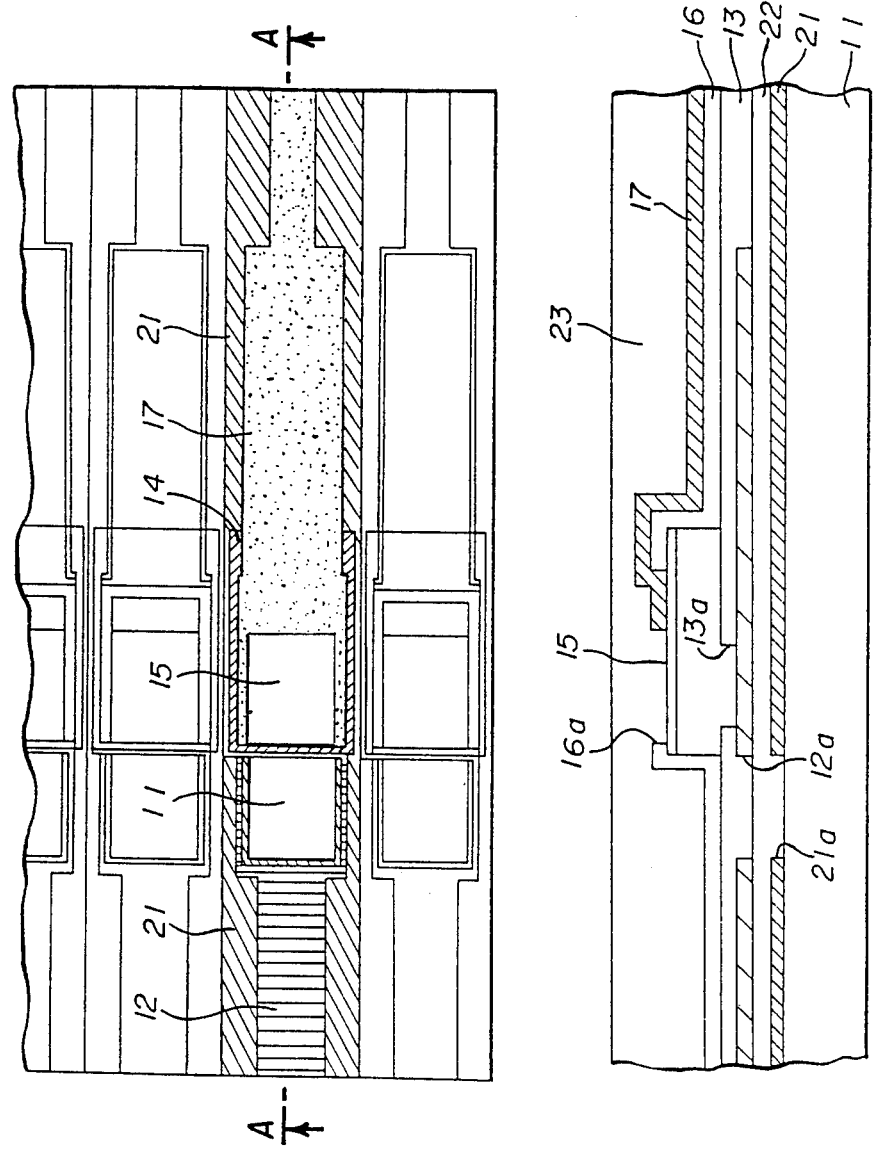
FIGS. 4A and 4B are a plan view and a cross sectional view respectively showing a second embodiment of the contact type image sensor according to the present invention.

FIGS. 4A and 4B respectively show a second embodiment of the contact type image sensor according to the present invention. FIG. 4B shows a cross section taken along a line A—A in FIG. 4A. In FIGS. 4A and 4B, those parts which are essentially the same as those corresponding parts in FIG. 3 are designated by the same reference numerals, and a description thereof will be omitted.

In FIGS. 4A and 4B, a shield layer 21 is formed on the substrate 11 and a dielectric layer 22 is formed on the shield layer 21. The shield layer 21 has a window 21a, and the lower electrode 12 formed on the dielectric layer 22 has a window 12a at a position corresponding to that of the hole 21a for receiving the incident light. The image sensor additionally has a protecting layer 23 formed on top thereof. FIG. 4A shows a plurality of contact type image sensors arranged in a main scanning direction, but it is of course not essential that a plurality of contact type image sensors are arranged in this manner.

According to this embodiment, the protecting layer 23 makes direct contact with the document when reading the document image, without the use of an equimagnification imaging system. Hence, it is possible to make the optical apparatus using the image sensor compact.

Figure 5:
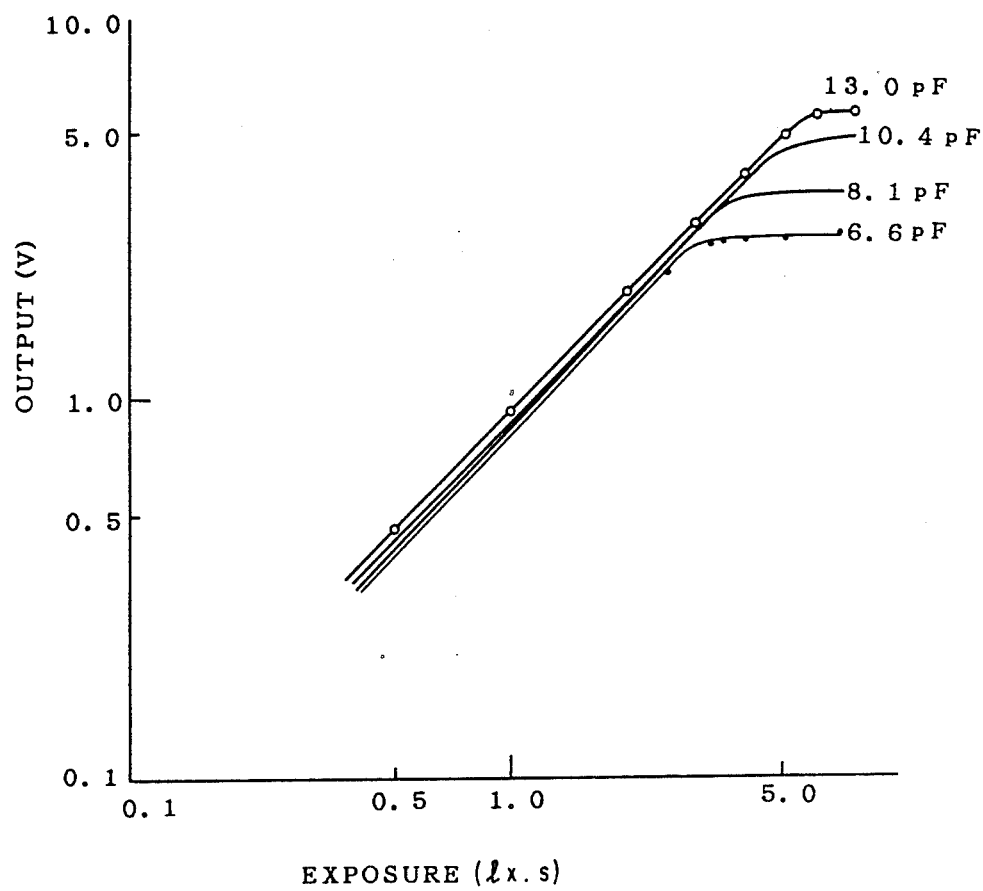
FIG. 5 is shows an exposure versus output characteristic of the second embodiment.
Figure 6A:
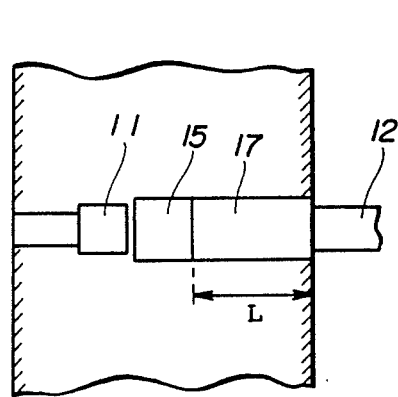
FIG. 6A is a plan view showing an essential part of the second embodiment.
Figure 6B:
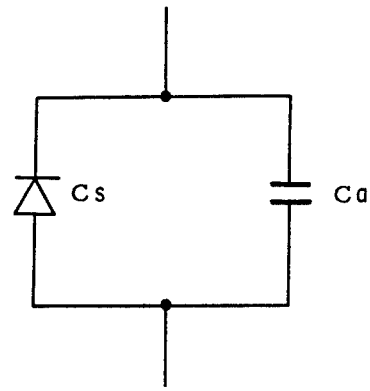
FIG. 6B is a circuit diagram showing an equivalent circuit of the second embodiment.

FIG. 5 shows an exposure versus output characteristic of the second embodiment of the contact type image sensor by taking the capacitance of the image sensor as the parameter. The measurements were made by changing the length L of the upper electrode 17 confronting the lower electrode 12 in FIG. 6A to change the shape and thus the capacitance of the image sensor. Each value of the capacitance was obtained by calculation. In FIG. 6A, those parts which are the same as those corresponding parts in FIGS. 4A and 4B are designated by the same reference numerals, and a description thereof will be omitted. FIG. 6B shows an equivalent circuit of the image sensor shown in FIG. 6A. In FIG. 6B, Cs denotes the capacitance of the sensor part and Ca denotes the added capacitance. The (storage) capacitance C of the image sensor is described by $C = Cs + Ca$.

The output of the image sensor was measured at each exposure (illuminance x reading time) by varying the surface illuminance of the image sensor. As may be seen from FIG. 5, the saturation exposure and thus the saturation voltage increase proportionally to the capacitance C.

The contact type image sensor having the charge storage mode has such a characteristic that the output changes linearly at an illuminance below the saturation exposure and the output saturates over the saturation exposure. The saturation exposure Es can be described by $Es = (C \times V)/S$, where C denotes the (storage) capacitance (F) of the image sensor, V denotes the applied voltage (V) and S denotes the sensitivity (A/lx) of the image sensor. Hence, the capacitance C must be set so that the output of the image sensor does not saturate even when a white document image is read. The added capacitance Ca shown in FIG. 6B makes it possible to read the document up to the exposure of $(Cs + Ca) \times V/S$ without saturation.

Figure 7:
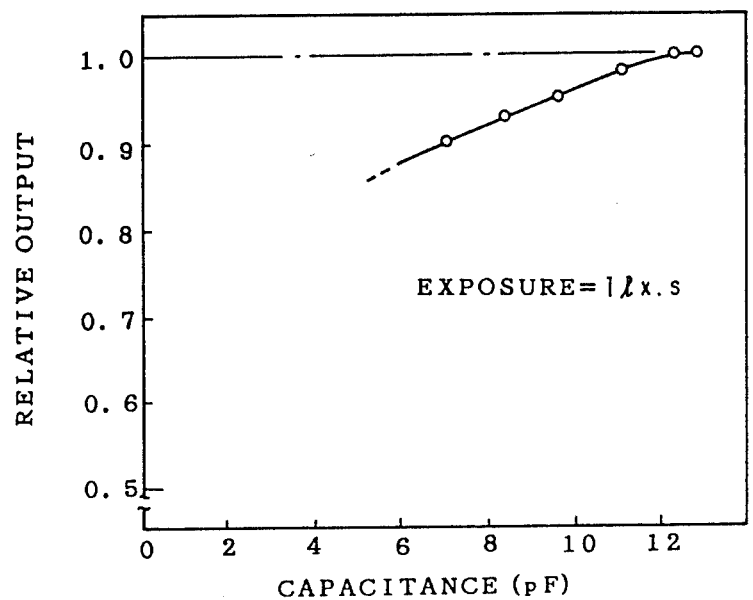
FIG. 7 shows a capacitance versus relative output characteristic of the second embodiment.

FIG. 7 shows a capacitance versus relative output characteristic of the second embodiment. This characteristic was measured by keeping the exposure constant at 1 (lx·s). It is seen that the output of the image sensor is proportional to the capacitance of the image sensor and saturates at the capacitance of over 12 (pF), and a large output is obtainable by appropriately selecting the capacitance of the image sensor.

Figure 8:
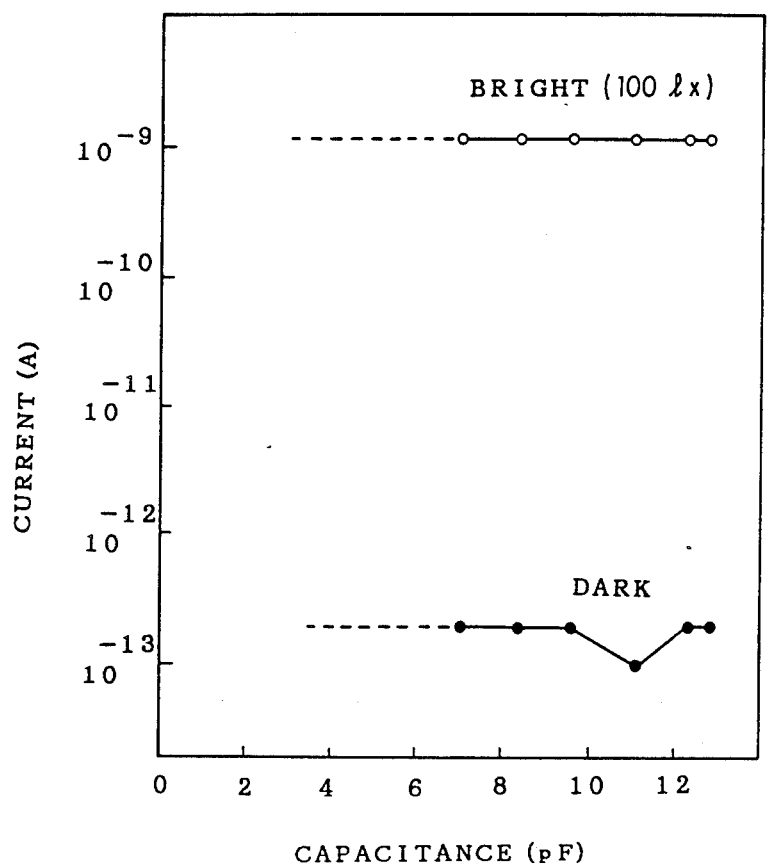
FIG. 8 shows a capacitance versus current characteristic of the second embodiment.

FIG. 8 shows a capacitance versus current characteristic of the second embodiment. The current is measured by applying a voltage of 5 (V) under a bright condition with an illuminance of 100 (lx) and under a dark condition. It is seen that the currents under both conditions virtually do not change even when the capacitance is relatively large. Hence, as described before, it is possible to obtain a large ratio of (photocurrent)/(dark current).

In the described embodiments, amorphous silicon hydride is used for the semiconductor layer 14, but the amorphous silicon hydride layer may be constituted by a single layer or two or more layers. The amorphous silicon hydride layer constituted by two or more layers may include a p-i (p-type-intrinsic) junction or a p-i-n (p-type-intrinsic-n-type) junction. Furthermore, the semiconductor layer 14 may be constituted by two or more layers with a heterojunction including a amorphous silicon hydride layer which includes oxygen and an amorphous silicon hydride layer. In this case, the ratio (photo-current)/(dark current) becomes large and it is possible to obtain an extremely satisfactory characteristic.

High resistance and high withstand voltage are required of the transparent dielectric layers 13, 16 and 22. It is possible to obtain a $SiO_xN_y$ layer having a high quality with a resistivity in the range of $10^{15}$ Ωm to $10^{16}$ Ωm and a withstand voltage in the range of 8 MV/cm to 10 MV/cm by a PCVD using $SiH_4$ gas, $Co_2$ gas and $N_2$ gas. By use of such a $SiO_xN_y$ layer, it is possible to form a capacitance having a high insulating characteristic.

The semiconductor layer constituting the photoelectric conversion part may or may not be divided in bits. In addition, the upper and lower electrodes may be interchanged.

Therefore, according to the present invention, the sensor part is constituted by the semiconductor thin film which functions as the photoelectric conversion layer and the capacitance is constituted by the transparent dielectric layer, and the semiconductor thin film and the transparent dielectric layer are formed on the plane of the lower electrode layer. Hence, the capacitance enables a large output to be obtained from the image sensor in the charge storage mode, and the undesirable effects of the line capacitance of the interconnections are minimized. As a result, the document image can be read with high resolution and accuracy, and the reproducibility is extremely satisfactory.

Further, the present invention is not limited to these embodiments, but various variations and modifications may be made without departing from the scope of the present invention.

What is claimed is:

1. A contact type image sensor comprising:
   a transparent dielectric substrate;
   an upper transparent electrode;
   a lower electrode provided on said transparent dielectric substrate;
   a semiconductor thin film sandwiched between said upper transparent electrode and said lower electrode and constituting a photoelectric conversion part;
   a transparent dielectric layer formed on a plane on which said lower electrode is provided; and
   an upper electrode formed on said transparent dielectric layer and connected to said upper transparent electrode,
   said transparent dielectric layer covering all exposed surfaces of said semiconductor thin film excluding surfaces which make contact with said upper transparent electrode and said lower electrode,
   said upper electrode, said transparent dielectric layer and said lower electrode forming a capacitor structure.

2. A contact type image sensor as claimed in claim 1 in which said transparent dielectric layer includes a first transparent dielectric layer formed directly on said lower electrode and having a window through which said semiconductor thin film makes contact with said lower electrode, and a second transparent dielectric layer formed on said first transparent dielectric layer and covering all exposed surfaces of said semiconductor thin film excluding the surfaces which make contact with said upper transparent electrode.

3. A contact type image sensor as claimed in claim 1 in which said semiconductor thin film is made of an amorphous semiconductor selected from a group at least including amorphous silicon hydride.

4. A contact type image sensor as claimed in claim 1 in which said transparent dielectric layer is made of a material selected from a group at least including $SiO_2$ and $SiO_xN_y$.

5. A contact type image sensor as claimed in claim 1 in which a thickness of said transparent dielectric layer is selected depending on the desired capacitance of said capacitor structure.

6. A contact type image sensor comprising:
   a transparent dielectric substrate;
   a lower electrode formed on said transparent dielectric substrate;
   a transparent dielectric layer formed on a plane on which said lower electrode is provided, said transparent dielectric layer having a window;
   a semiconductor thin film formed on said lower electrode at said window and constituting a photoelectric conversion part;
   an upper transparent electrode formed on said semiconductor thin film; and
   an upper electrode formed on said transparent dielectric layer and connected to said upper transparent electrode,
   said transparent dielectric layer covering all exposed surfaces of said semiconductor thin film excluding surfaces which make contact with said upper transparent electrode and said lower electrode,
   said upper electrode, said transparent dielectric layer and said lower electrode forming a capacitor structure.

7. A contact type image sensor as claimed in claim 6 in which said transparent dielectric layer includes a first transparent dielectric layer formed directly on said lower electrode and having a window through which said semiconductor thin film makes contact with said lower electrode, and a second transparent dielectric layer formed on said first transparent dielectric layer and covering all exposed surfaces of said semiconductor thin film excluding the surfaces which make contact with said upper transparent electrode.

8. A contact type image sensor as claimed in claim 6 in which said semiconductor thin film is made of an amorphous semiconductor selected from a group at least including amorphous silicon hydride.

9. A contact type image sensor as claimed in claim 6 in which said transparent dielectric layer is made of a material selected from a group at least including $SiO_2$ and $SiO_xN_y$.

10. A contact type image sensor as claimed in claim 6 in which a thickness of said transparent dielectric layer is selected depending on the desired capacitance of said capacitor structure.

11. A contact type image sensor comprising:
    a transparent dielectric substrate;
    a shield layer formed on said transparent dielectric substrate, said shield layer having a first window;
    a dielectric layer formed on said shield layer;
    a lower electrode formed on said transparent dielectric substrate, said lower electrode having a second window at a position corresponding to said first window;
    a transparent dielectric layer formed on a plane on which said lower electrode is provided, said transparent dielectric layer having a third window;
    a semiconductor thin film formed on said lower electrode at said third window and constituting a photoelectric conversion part;
    an upper transparent electrode formed on said semiconductor thin film; and
    an upper electrode formed on said transparent dielectric layer and connected to said upper transparent electrode,
    said transparent dielectric layer covering all exposed surfaces of said semiconductor thin film excluding surfaces which make contact with said upper transparent electrode and said lower electrode,
    said upper electrode, said transparent dielectric layer and said lower electrode forming a capacitor structure.

12. A contact type image sensor as claimed in claim 11 in which said transparent dielectric layer includes a first transparent dielectric layer formed directly on said lower electrode and having a third window through which said semiconductor thin film makes contact with said lower electrode, and a second transparent dielectric layer formed on said first transparent dielectric layer and covering all exposed surfaces of said semiconductor thin film excluding the surfaces which makes contact with said upper transparent electrode.

13. A contact type image sensor as claimed in claim 11 in which said semiconductor thin film is made of an amorphous semiconductor selected from a group at least including amorphous silicon hydride.

14. A contact type image sensor as claimed in claim 11 in which said transparent dielectric layer is made of a material selected from a group at least including $SiO_2$ and $SiO_xN_y$.

15. A contact type image sensor as claimed in claim 11 in which a thickness of said transparent dielectric layer is selected depending on the desired capacitance of said capacitor structure.

16. A contact type image sensor as claimed in claim 11 which further comprises a protecting layer formed on a top thereof.

* * * * *